(12) United States Patent
Grasser et al.

(10) Patent No.: US 8,068,267 B2
(45) Date of Patent: Nov. 29, 2011

(54) SPECKLE REDUCTION IN DISPLAY SYSTEMS THAT EMPLOY COHERENT LIGHT SOURCES

(75) Inventors: Regis Grasser, Orleans (FR); Hongqin Shi, San Jose, CA (US); Terry A. Bartlett, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 12/241,041

(22) Filed: Sep. 30, 2008

(65) Prior Publication Data

US 2010/0079848 A1    Apr. 1, 2010

(51) Int. Cl.
*G02F 1/153* (2006.01)

(52) U.S. Cl. .................................................. 359/267

(58) Field of Classification Search .................. 359/242, 359/267, 263
See application file for complete search history.

(56) References Cited

U.S. PATENT DOCUMENTS

| | | | |
|---|---|---|---|
| 6,559,827 B1 * | 5/2003 | Mangerson | 345/102 |
| 6,588,910 B2 * | 7/2003 | Shiraishi et al. | 353/119 |
| 2007/0063937 A1 * | 3/2007 | Kang et al. | 345/82 |
| 2009/0168025 A1 * | 7/2009 | Domm | 353/20 |
| 2009/0219958 A1 * | 9/2009 | Mizushima et al. | 372/22 |
| 2009/0303420 A1 * | 12/2009 | Kim et al. | 349/96 |
| 2010/0220293 A1 * | 9/2010 | Mizushima et al. | 353/20 |

* cited by examiner

*Primary Examiner* — Joseph P Martinez
(74) *Attorney, Agent, or Firm* — Charles A. Brill; Wade James Brady, III; Frederick J. Telecky, Jr.

(57) ABSTRACT

Speckle effect in display system is reduced by utilizing the instability of phase-coherent light and the transmission of the instable phase-coherent light through a multi-mode optical fiber with a suitable length.

23 Claims, 2 Drawing Sheets

SPECKLE REDUCTION IN DISPLAY SYSTEMS THAT EMPLOY COHERENT LIGHT SOURCES

TECHNICAL FIELD OF THE DISCLOSURE

The technical field of this disclosure relates to the art of display systems; and more particularly to the art of speckle reduction in display systems that employ phase-coherent light.

BACKGROUND OF THE DISCLOSURE

In recent years, solid-state light sources and other narrow-wavelength-band and/or polarized light sources capable of producing visible light have drawn significant attention as alternative light sources to traditional light sources for use in imaging systems (such as projection systems). This attention has been due to many advantages of these light sources, such as compact size, greater durability, longer operating life, higher efficiency, and lower power consumption. For example, solid state sources such as LASERs, light-emitting-diodes (LEDs), and pumped non-linear optical crystals are increasingly being used or considered for use in imaging systems, e.g. imaging systems that employ one or more light valves each of which comprises an array of individually addressable pixels due to their low Etendue or low divergence. Solid state light sources enable illumination systems and display systems to have a reduced size and/or cost.

Regardless of certain superior properties over traditional light sources, solid-state light sources may produce unwanted artificial effects, one of which is speckle effect. Speckle patterns are often classified as either "objective" or "subjective" speckle depending on how they appear and behave. As coherent light propagates from a source to a detector plane it can encounter random path length differences that sum coherently to produce random intensity fluctuations that can be measured at the detector. These random intensity fluctuations often referred to as objective speckle, are independent of the viewer location. Subjective speckle is the random intensity variation that occurs within the viewer's vision due to the coherent light being viewed through the eye's aperture. Subjective speckle can be differentiated from objective speckle by the fact that the subjective speckle pattern changes as the viewer moves his head while viewing the speckle pattern.

In display applications using coherent light, such as light from solid-state illuminators, speckles accompanying the desired image displayed on a screen module the intensity of the desired image, and thus may significantly degrade the quality of the displayed image. Therefore, elimination or reduction of the speckle effect in display applications using phase-coherent light is highly desirable.

SUMMARY

In one example, a speckle reduction method for use in a display system is disclosed herein, the method comprising: providing a light that is phase-coherent, wherein at least a phase-coherency of the light varies over time; causing a phase-coherency variation of the light by passing the light through a multi-mode optical fiber; and producing an image using the light with the phase-coherency variation.

In another example, a speckle reduction method for use in a display system is disclosed herein, the method comprising: providing a light with a phase-coherency that varies over time; illuminating an array of micromirrors of a light valve by the light; and modulating the light by the micromirrors so as to produce an image.

In yet another example, a display system is provided herein, the display system comprising: a light source providing a light that is phase-coherent, wherein at least a phase-coherency of the light varies over time; phase-variation means for causing a phase-coherency variation; and imaging means for producing an image using the light with the phase-coherency variation.

DETAILED DESCRIPTION OF SELECTED EXAMPLES

Disclosed herein is a method of reducing speckle effect in display systems that employ phase-coherent light. The speckle effect is reduced by using phase-coherent light that exhibits an instable profile, such as instable phase profile (e.g. mode hoping), during operation. The instable phase-coherent light is passed through a multi-mode optical fiber so as to trigger a variation of the instable profile, in particular, the phase profile, at the exit of the multi-mode optical fiber. The profile variation in turn creates a modification in the speckle pattern. The modified speckle pattern exhibits reduced contrast and appears as a noise background to the viewer. The method is capable of reducing the speckle effect without moving an element disposed in the optical axis of the display system or in the propagation path of the illumination light in the display system.

The speckle reduction method will be discussed in the following with particular examples wherein the speckle effect is reduced in display systems that employ lasers. However, it will be appreciated by those skilled in the art that the following discussion is for demonstration purpose, and should not be interpreted as a limitation. Other variations within the scope of this disclosure are also applicable. For example, the method is also applicable to display system or other imaging applications having the speckle effect that is caused by lasers or other types of phase-coherent light sources than lasers.

Figure 1A:
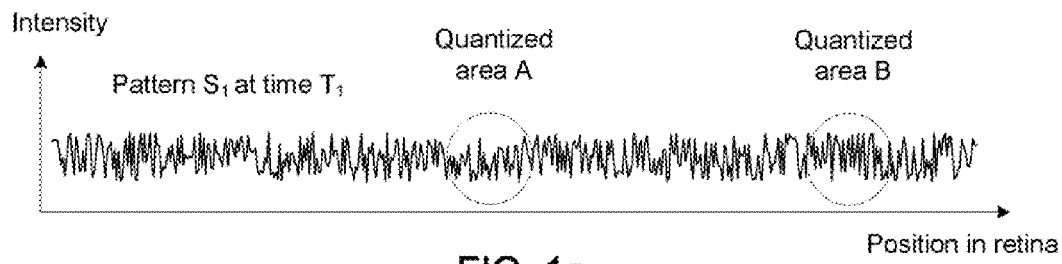
FIG. 1a through FIG. 1c schematically demonstrate a method of reducing speckle effect in display applications using phase-coherent light, wherein FIG. 1a schematically illustrates a speckle pattern on a screen at an instant time $T_1$ due to the speckle effect; wherein FIG. 1b schematically illustrates multiple speckle patterns generated by phase-coherent light at other instant times $T_2$, $T_3$, and $T_4$; and wherein FIG. 1c schematically illustrates an integrated speckle pattern perceived by viewers eyes, which appears as a reduced speckle noise background to viewers.
Figure 1B:
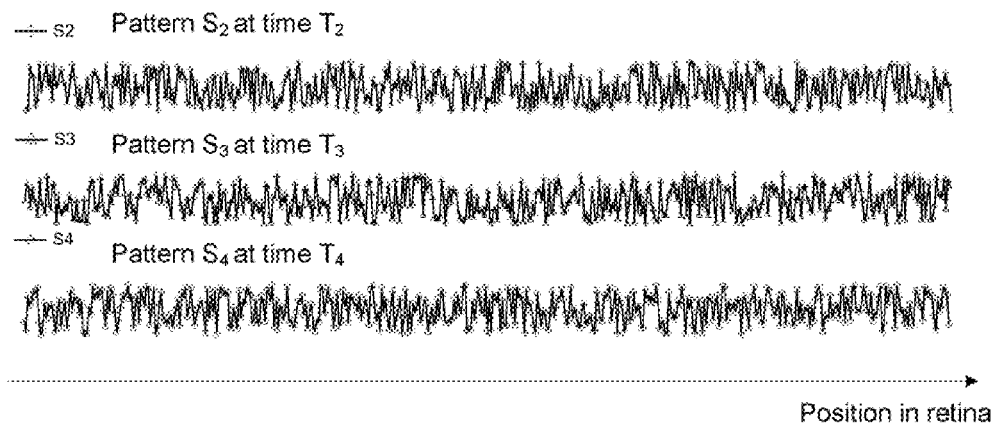
Figure 1C:
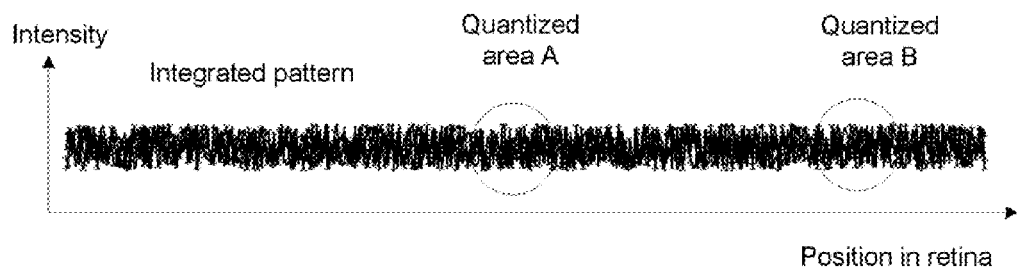

FIG. 1a through FIG. 1c schematically illustrates a method of reducing the speckle effect in a display system that employs phase-coherent light. For demonstration purposes, FIG. 1a illustrates an exemplary speckle pattern $S_1$ perceived by the retina of a viewer at an instance time $T_1$. This speckle pattern can be a subjective or objective speckle pattern or a combination thereof. The speckle pattern $S_1$ comprises speckles that appear to be quantized areas with randomly varying intensities to viewers. Speckles or quantized areas, such as quantized areas A and B, of different intensities in the speckle pattern can be perceived by viewers. The speckle effect can be reduced by modifying the speckle pattern $S_1$ such that the perceived contrast ratio of the modified speckle pattern is less significant than the speckle pattern $S_1$; and the modified speckle pattern appears as a noise background to the viewer. The modification can be accomplished by utilizing the instability of the phase-coherent light.

It has been observed that lasers, as well as other types of phase-coherent light sources, often exhibit instability in profile of the output phase-coherent light. In particular, lasers currently used in display systems often exhibit mode hopping during operation. The mode hopping can be as fast as less than the integration time of human eyes, such as 100 microseconds or less, 50 microseconds or less, 10 microseconds or less, 5 microseconds or less, and 1 microsecond or less. Because of the profile variation (e.g. the variation of the phase-profile), the speckle pattern caused by the phase-coherent light can be different at different times as diagrammatically illustrated in FIG. 1b.

Referring to FIG. 1b, a number of different speckle patterns can be generated by the phase-coherent light within the integration time of human eyes. For example, speckle pattern $S_2$ is generated by the phase-coherent light at instant time $T_2$, which can be different from speckle pattern $S_1$ at time $T_1$. Speckle patterns $S_3$ and $S_4$ are generated by the phase-coherent light at instant times $T_2$ and $T_3$, each of which can be different from speckle patterns $S_1$ and $S_2$. The different speckle patterns are integrated by human eyes during the integration time of the human eyes. The integrated speckle pattern has a less contrast ratio that that of a single speckle pattern (e.g. speckle pattern $S_1$, $S_2$, $S_3$, or $S_4$); and appears as a noise background to the viewer, as diagrammatically illustrated in FIG. 1c.

Referring to FIG. 1c, the constructive and destructive interference in individual speckle patterns $S_1$, $S_2$, $S_3$ and $S_4$ are randomly distributed in the integrated speckle pattern. As a consequence, individual speckle patterns are averaged out; and the integrated speckle pattern exhibits a contrast ratio less than the contrast ratio of individual speckle patterns. The integrated speckle pattern then appears as noise background to the viewer. The magnitude of the speckle noise is often described using a speckle contrast number given by $$\frac{\sigma_I}{\langle I \rangle},$$

or the ratio of the standard deviation of the intensity to the mean value. It has been shown that displaying N independent speckle patterns within the integration period of the eye, the apparent speckle contrast can be reduced by a factor of the square root of N.

Figure 2:
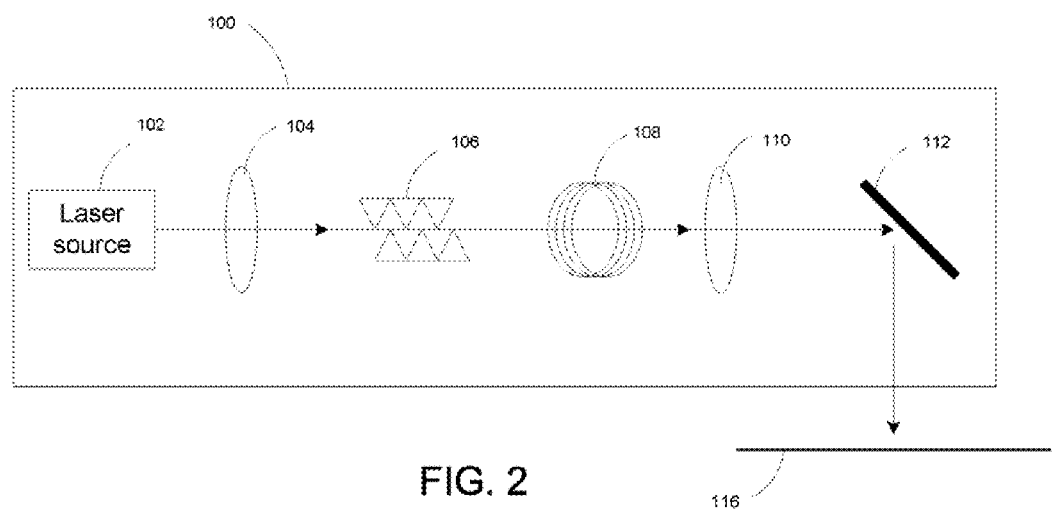
FIG. 2 is a block diagram of an exemplary display system implemented therein a method of reducing speckle effect.

The method as discussed above can be implemented in various types of display systems and implemented in one type of display systems in many different ways. For demonstration purposes, FIG. 2 diagrammatically illustrates a block diagram of an exemplary display system in which the above speckle reduction method is implemented. Referring to FIG. 2, the display system (100) comprises a laser source, a multi-mode optical fiber 108, and light valve 112. Other components, such as optics 104, 110, and 114 and optical scrambler 106 can alternatively be provided, even though may not be required.

The laser source (102) provides lasers with an instable profile, such as instable phase-profile due to mode hopping. Various laser sources can be used, such as vertical cavity surface emitting lasers (VCSEL), extended cavity surface emitting lasers (e.g. NECSEL), and other laser sources. The laser from the laser source (102) is directed to and coupled to multi-mode optical fiber 108, by for example, optics 104. The laser light propagates along different paths or inside the core of the multi-mode optical fiber (108).

Various multi-mode optical fibers can be used herein. The number of modes supported by a multi-mode optical fiber can be rewritten as:

$$M = 2\left(\frac{\pi}{\lambda} r \times NA\right)^2$$

Figure 3:
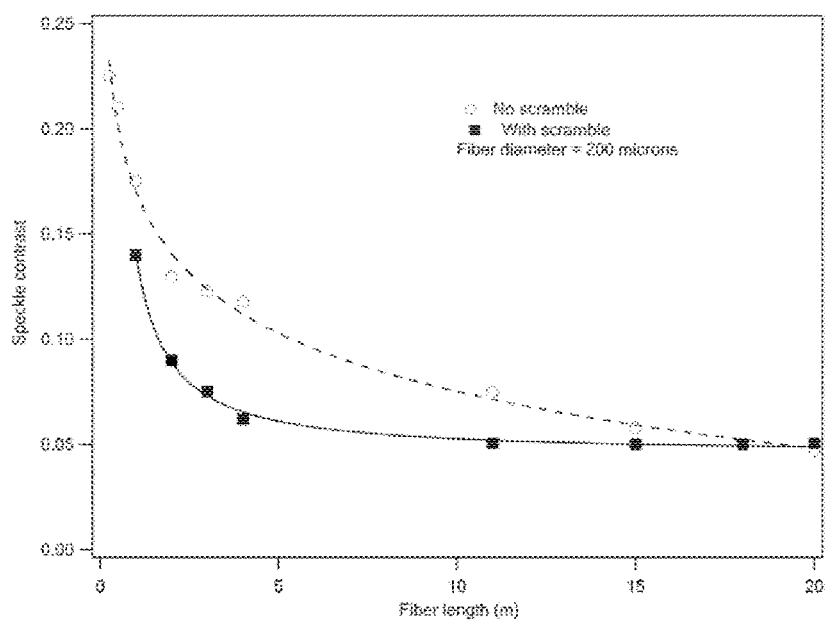
FIG. 3 is a diagram showing the speckle contrast vs. optical fiber length in the display system in FIG. 2.

M is the total number of bounded modes in the multi-mode optical fiber. $\lambda$ is the wavelength of the laser light traveling inside the multi-mode optical fiber; and r is the radius of the core of the multi-mode optical fiber. NA is the numerical aperture of the multi-mode optical fiber. In one example wherein the laser light is green light is traveling inside a multi-mode optical fiber having a core radius r of 250 microns and an acceptance angle of 12.7° (NA=0.22), the number of bounded modes supported by the multi-mode optical fiber is around 210,000, which is far enough to support the phase variation of the laser light traveling inside in terms of number of modes of the laser light. In order for the large number of modes to contribute to speckle contrast reduction the individual modes are expected to be sufficiently phase de-correlated from one another. Accordingly the path length differences between the modes are expected to be longer than the source temporal coherence length. The source coherence length can be approximated by $\lambda^2/\Delta\lambda$, or the ratio of the center wavelength squared divided by the size of the waveband. Because the number of the de-correlated modes increases monotonically with the increase in optical fiber length, the speckle effect can be reduced. FIG. 3 diagrammatically shows an example of laboratory measurements that illustrate a reduction in speckle contrast as the fiber increases in length.

Referring to FIG. 3, the speckle contrasts of a speckle pattern (e.g. the integrated speckle pattern perceived by human eyes) caused by laser light passing through exemplary multi-mode optical fibers with core radius 200 microns and different lengths are shown by open-circles in the diagram. The contrast ratio decreases dramatically as the length of the multi-mode optical fiber increases from 0 to around 3 meters, and saturates when the length of the multi-mode optical fiber is 3 meters or longer.

Referring back to FIG. 2, the laser light exit from multi-mode optical fiber (108) can be directed to light valve 112 for illuminating the pixels of light valve 112. The light valve comprises an array of individually addressable pixels, such as deflectable micromirrors (e.g. DMD micromirrors, a product of Texas Instruments, Inc.), or liquid-crystal-on-silicon devices, etc. Because the laser light is incident to the pixels of the light valve from different propagation paths, objective speckle patterns may occur at the light valve pixels. Such object speckle patterns can be imaged onto the display target (116) on which the desired image to be displayed or can be imaged to the viewer's eyes. However, the objective speckle patterns are modified due to the instability of the laser light and the transmission within the multi-mode optical fiber. The modified speckle patterns exhibit reduced contrast ratio and appear as a noise background to the viewer after the integration of the viewer's eyes.

In instances of subjective speckle patterns that occur due to the random interference of laser light on the display target (116), the subjective patterns are modified by the profile (e.g.

the phase-profile) variation of the laser light that exits the multi-mode optical fiber. The modified speckle patterns exhibit reduced contrast ratio and appear as a noise background to the viewer after the integration of the viewer's eyes.

The contrast ratio of the speckle pattern can be further reduced by providing a mode scrambler (106) between the laser source (102) and the entrance of the multi-mode optical fiber (108). The mode scrambler can be used to distribute the laser light over a larger number of modes within the numerical aperture of the multi-mode optical fiber. FIG. 3 also demonstratively shows the effect of the mode scrambler in the display system.

Referring again to FIG. 3, the speckle contrast of speckle patterns in a display system that employs a scrambler (106) is shown by solid-squares. The contrast ratio with the scrambler decreases dramatically as the length of the multi-mode optical fiber increases from 0 to around 4 meters, and saturates when the length of the multi-mode optical fiber is 4 meters or longer. The contrast ratios for speckle patterns in a display system with a scrambler are smaller than those in a display system without a scrambler.

In addition to mode scrambler, other techniques can alternatively be employed for further reducing the speckle effect in display systems. For example, the entrance of the multi-mode optical fiber 108 can be vibrated, for example, by a micro-stepper or other mechanisms so as to enhance the coupling of different modes during the propagation inside the multi-mode optical fiber.

The utilization of a multi-mode optical fiber also helps to reduce the speckle effect in terms of depolarization of laser light. The laser light exiting from the laser source is highly polarized. Laser light with increased polarization increases the phase-coherence, and in turn, increases the speckle effect. The propagation of the polarized laser light through a multi-mode optical fiber (preferably with a minimum length, such as substantially equal to the length of the temporal coherence of the laser light travelling inside) can randomize the polarization. This arises from the random birefringence of the multi-mode optical fiber and its sensitivity to environmental conditions. For example, variations in stress due to small temperature variations within the multi-mode optical fiber or air flow into the multi-mode optical fiber (or air flow around the multi-mode optical fiber) can be sufficient to rapidly modify the birefringence of the multi-mode optical fiber and therefore the polarization states of the existing laser light from the multi-mode optical fiber. The laser light with modified polarization state can have a reduced polarization and become depolarized. Depolarized light offers speckle reduction by generating different de-correlated speckle patterns that are averaged out. This speckle reduction can be effective for both objective and subjective speckle patterns.

It is noted that the above method can be implemented in other types of display systems, which may or may not employ light valves. For example, the method can be implemented in a display system having a light valve, such as that in FIG. 2; and the display system can be configured as a front projector, a rear-projection TV, or other type of imaging system. The above method is also applicable to scanning display systems. The light source can be coupled to one or more suitable multi-mode optical fibers, for example, a multi-mode optical fiber for each light color. The light exiting from the multi-mode optical fiber(s) can then be used for scanning a display target so as to generate desired images.

As can be seen from the above, the method is capable of reducing the speckle effect in display systems without moving an element, such as the light source, the optics, the light valve, or other elements, such as a birefringent element, disposed in the major optical axis of the display system or in the propagation path of the illumination light in the display system. However, a technique of moving one or more elements in a display system for speckle reduction can be used with the method of this disclosure.

It will be appreciated by those of skill in the art that a new and useful method for speckle reduction and an optical system capable of speckle reduction have been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

We claim:

1. A display system comprising:
    a light source operable to produce a phase-coherent beam of light along an optical path;
    a multi-mode optical fiber on the optical path, the optical fiber being at least 3 meters long;
    a mode scrambler on the optical path between the light source and the optical fiber; and
    a spatial light modulator to modulate light from the optical fiber to form an image on an image plane.

2. The display system of claim 1, wherein the optical fiber has a temperature difference sufficient to reduce the polarization of light passing through the optical fiber.

3. The display system of claim 1, comprising:
    a cooling system to create a temperature difference along the optical fiber sufficient to reduce the polarization of light passing through the optical fiber.

4. The display system of claim 1, comprising:
    a vibrator to vibrate an entrance of the optical fiber.

5. A display system comprising:
    a light source operable to produce a phase-coherent beam of light along an optical path;
    a multi-mode optical fiber on the optical path, the optical fiber having a length sufficient to reduce a speckle contrast of the beam of light to less than 0.15;
    a mode scrambler on the optical path between the light source and the optical fiber; and
    a spatial light modulator to modulate light from the optical fiber to form an image on an image plane.

6. The display system of claim 5, wherein the optical fiber has a temperature difference sufficient to reduce the polarization of light passing through the optical fiber.

7. The display system of claim 5, comprising:
    a cooling system to create a temperature difference along the optical fiber sufficient to reduce the polarization of light passing through the optical fiber.

8. The display system of claim 5, comprising:
    a vibrator to vibrate an entrance of the optical fiber.

9. A display system comprising:
    a light source operable to produce a phase-coherent beam of light along an optical path;
    a multi-mode optical fiber on the optical path, the optical fiber providing multiple path lengths to the beam of light, wherein a path length difference between at least two modes is longer than the source temporal coherency length;
    a mode scrambler on the optical path between the light source and the optical fiber; and a spatial light modulator to modulate light from the optical fiber to form an image on an image plane.

10. The display system of claim 9, wherein the optical fiber has a temperature difference sufficient to reduce the polarization of light passing through the optical fiber.

11. The display system of claim 9, comprising:
a cooling system to create a temperature difference along the optical fiber sufficient to reduce the polarization of light passing through the optical fiber.

12. The display system of claim 11, wherein the beam of light has a plurality of unstable modes.

13. The display system of claim 9, comprising:
a vibrator to vibrate an entrance of the optical fiber.

14. The display system of claim 9, wherein the beam of light has a plurality of unstable modes.

15. A display system comprising:
a light source operable to produce a phase-coherent beam of light along an optical path;
a multi-mode optical fiber on the optical path, the optical fiber being at least 3 meters long, wherein the optical fiber has a temperature difference sufficient to reduce the polarization of light passing through the optical fiber; and
a spatial light modulator to modulate light from the optical fiber to form an image on an image plane.

16. The display system of claim 15, comprising:
a cooling system to create at least some of the temperature difference along the optical fiber.

17. The display system of claim 15, comprising:
a vibrator to vibrate an entrance of the optical fiber.

18. A display system comprising:
a light source operable to produce a phase-coherent beam of light along an optical path;
a multi-mode optical fiber on the optical path, the optical fiber having a length sufficient to reduce a speckle contrast of the beam of light to less than 0.15, wherein the optical fiber has a temperature difference sufficient to reduce the polarization of light passing through the optical fiber; and
a spatial light modulator to modulate light from the optical fiber to form an image on an image plane.

19. The display system of claim 18, comprising:
a cooling system to create at least some of the temperature difference along the optical fiber.

20. The display system of claim 19, comprising:
a vibrator to vibrate an entrance of the optical fiber.

21. A display system comprising:
a light source operable to produce a phase-coherent beam of light along an optical path;
a multi-mode optical fiber on the optical path, the optical fiber providing multiple path lengths to the beam of light, wherein a path length difference between at least two modes is longer than the source temporal coherency length, and wherein the optical fiber has a temperature difference sufficient to reduce the polarization of light passing through the optical fiber; and
a spatial light modulator to modulate light from the optical fiber to form an image on an image plane.

22. The display system of claim 21, comprising:
a cooling system to create at least some of the temperature difference along the optical fiber.

23. The display system of claim 21, comprising:
a vibrator to vibrate an entrance of the optical fiber.

* * * * *